(12) United States Patent
Rozgo et al.

(10) Patent No.: US 8,446,220 B2
(45) Date of Patent: May 21, 2013

(54) METHOD AND APPARATUS FOR INCREASING THE EFFECTIVE RESOLUTION OF A SENSOR

(75) Inventors: Paul Rozgo, Dublin, OH (US); Ryan Jones, Dublin, OH (US); Lamar Floyd Ricks, Lewis Center, OH (US)

(73) Assignee: Honeywell International Inc., Morristown, NJ (US)

( * ) Notice: Subject to any disclaimer, the term of this patent is extended or adjusted under 35 U.S.C. 154(b) by 38 days.

(21) Appl. No.: 13/103,913

(22) Filed: May 9, 2011

(65) Prior Publication Data

US 2012/0286872 A1  Nov. 15, 2012

(51) Int. Cl.
*H03F 1/00* (2006.01)

(52) U.S. Cl.
USPC .......................................... 330/174; 324/251

(58) Field of Classification Search
USPC .................. 330/174; 324/251, 207.2, 511
See application file for complete search history.

(56) References Cited

U.S. PATENT DOCUMENTS

| | | |
|---|---|---|
| 3,484,732 A | 12/1969 | Postma |
| 4,478,076 A | 10/1984 | Bohrer |
| 4,478,077 A | 10/1984 | Bohrer et al. |
| 4,501,144 A | 2/1985 | Higashi et al. |
| 4,574,640 A | 3/1986 | Krechmery |
| 4,581,928 A | 4/1986 | Johnson |
| 4,651,564 A | 3/1987 | Johnson et al. |
| 4,683,159 A | 7/1987 | Bohrer et al. |
| 4,986,127 A | 1/1991 | Shimada et al. |
| 5,042,307 A | 8/1991 | Kato |

(Continued)

FOREIGN PATENT DOCUMENTS

| | | |
|---|---|---|
| DE | 10235682 A1 | 2/2004 |
| EP | 0235912 A2 | 9/1987 |
| JP | 2001268364 A | 9/2001 |

OTHER PUBLICATIONS

Broki et al., "Digital DC Offset Compensation of Analog-to-Digital Converters," JPL Technical Report 32-1526, vol. XV11, pp. 45-47, prior to May 9, 2011.

(Continued)

*Primary Examiner* — Robert Pascal
*Assistant Examiner* — Khiem Nguyen
(74) *Attorney, Agent, or Firm* — Seager Tufte & Wickhem LLC.

(57) ABSTRACT

Methods and devices for increasing a sensor resolution are disclosed. In one example, a two measurement process is used. A first measurement is used to effectively measure across a full range (e.g. 0 to 5 VDC) of the sensor. This first measurement may identify the current operating point of the sensor (e.g. 3.5 VDC). A second measurement may then be made to effectively measure across a sub-range of the sensor that encompasses the current operating point of the sensor (e.g. across a sub-range of 3.0 to 4.0 VDC for a current operating point of 3.5 VDC). The gain of the amplifier may be raised during the second measurement to produce a higher resolution measurement. In some cases, the first measurement may be used to determine an appropriate offset that may be applied so as to scale the amplifier to the desired sub-range of sensor that includes the current operating point of the sensor. In some cases, the two measurements may be used together to compute an effectively higher resolution measurement signal. In some cases, this may allow for a smaller and/or cheaper sensor to be used, while still achieving good results.

20 Claims, 7 Drawing Sheets

U.S. PATENT DOCUMENTS

| | | |
|---|---|---|
| 5,050,429 A | 9/1991 | Nishimoto et al. |
| 5,099,695 A | 3/1992 | Sugano et al. |
| 5,187,985 A | 2/1993 | Nelson |
| 5,193,393 A | 3/1993 | Czarnocki |
| 5,198,774 A | 3/1993 | Williams, II et al. |
| 5,460,050 A | 10/1995 | Miyano |
| 5,507,171 A | 4/1996 | Mattes et al. |
| 5,544,529 A | 8/1996 | Mitani et al. |
| 5,578,962 A | 11/1996 | Rastegar |
| 5,918,260 A | 6/1999 | Newman et al. |
| 6,047,244 A | 4/2000 | Rud, Jr. |
| 6,169,965 B1 | 1/2001 | Kubisiak et al. |
| 6,223,593 B1 | 5/2001 | Kubisiak et al. |
| 6,234,016 B1 | 5/2001 | Bonne et al. |
| 6,502,459 B1 | 1/2003 | Bonne et al. |
| 6,542,594 B1 | 4/2003 | LeBoulzec |
| 6,653,959 B1 | 11/2003 | Song |
| 6,684,711 B2 | 2/2004 | Wang |
| 6,724,202 B2 | 4/2004 | Tanizawa |
| 6,750,910 B1 | 6/2004 | Bilhan |
| 6,847,904 B2 * | 1/2005 | Blake et al. ............ 702/57 |
| 6,996,488 B2 | 2/2006 | Chu et al. |
| 7,085,628 B2 | 8/2006 | Ohmi et al. |
| 7,117,747 B2 | 10/2006 | Borzabadi et al. |
| 7,146,860 B2 | 12/2006 | Yeh et al. |
| 7,146,864 B2 | 12/2006 | Sullivan et al. |
| 7,185,538 B2 | 3/2007 | Hager et al. |
| 7,239,957 B1 | 7/2007 | Sweet et al. |
| 7,266,999 B2 | 9/2007 | Ricks |
| 7,318,351 B2 | 1/2008 | Cobianu et al. |
| 7,343,812 B2 | 3/2008 | Stewart et al. |
| 7,458,274 B2 | 12/2008 | Lamb et al. |
| 7,469,598 B2 | 12/2008 | Shkarlet et al. |
| 7,635,077 B2 | 12/2009 | Schubert |
| 7,775,105 B2 | 8/2010 | Khadkikar et al. |
| 7,923,997 B2 * | 4/2011 | Utsuno ............ 324/251 |
| 7,950,286 B2 | 5/2011 | Bentley |
| 8,193,807 B2 * | 6/2012 | Muraoka et al. ............ 324/251 |
| 2007/0000330 A1 | 1/2007 | Tysoe et al. |
| 2007/0197922 A1 | 8/2007 | Bradley et al. |
| 2009/0073274 A1 | 3/2009 | Dai |
| 2009/0319245 A1 | 12/2009 | Ivchenko et al. |
| 2010/0154551 A1 | 6/2010 | Bentley |
| 2010/0305465 A1 | 12/2010 | Ricks et al. |
| 2011/0025299 A1 | 2/2011 | Vulovic et al. |

OTHER PUBLICATIONS

Celerity, "Dual Range Transducer Display," 2 pages, 2006.
Gurevich, "ADC Offset in MSC12xx Devices," Texas Instruments, Application Report SBAA097B, 21 pages, Jul. 2003, Revised May 2004.
Martel Electronics, "PPC-3300 Precision Dual Range Pressure Calibrator," 2 pages, 2002.
ZMDI, "ZMD31050/ZMD31150 Advanced Sensor Signal Conditioner," Application Notes, Electronic Offset Compensation, Rev. 1.01, 4 pages, Apr. 2010.
ZMDI, "ZSC31050 Advanced Differential Sensor Signal Conditioner," Functional Description, Rev. 1.08, 50 pages, Jul. 2010.

* cited by examiner

METHOD AND APPARATUS FOR INCREASING THE EFFECTIVE RESOLUTION OF A SENSOR

FIELD

The present disclosure relates generally to sensors, and more particularly, to methods and devices for increasing the resolution of such sensors.

BACKGROUND

Sensors are commonly used to sense various parameters in a wide variety of applications including, for example, medical applications, flight control applications, industrial process applications, combustion control applications, weather monitoring applications, as well as many other applications. In some applications, users often desire increased sensor resolution in order to resolve smaller sensor signals and/or to control the dynamic range of such sensors.

SUMMARY

The present disclosure relates generally to sensors, and more particularly, to methods and devices for increasing the resolution of sensors during use. In one example, a two measurement process may be used. A first measurement may be used to effectively measure across a wide or full range (e.g. 0 to 5 VDC) of the sensor at hand, and may be used to identify the current operating point of the sensor (e.g. 3.5 VDC output). A second measurement may be used to measure across a sub-range of the sensor, where the sub-range encompasses the current operating point of the sensor determined during the first measurement (e.g. across a sub-range of 3.0 to 4.0 VDC for a current operating point of 3.5 VDC). The gain of the amplifier may be higher during the second measurement, which may produce a higher resolution measurement signal. To help prevent the amplifier from going out of range, the first measurement may be used to determine an appropriate offset that can be applied to the amplifier to offset the amplifier input to correspond to the desired sub-range that includes the current operating point of the sensor. In some cases, the result of the first measurement and the second measurement may be combined to provide an effectively higher resolution measurement signal from the sensor. In some cases, this may allow a smaller and/or cheaper sensor to be used, while still achieving good results.

In some cases, an analog sensor output signal may be received from a sensor. During a first measurement, the analog sensor output signal may be amplified by an amplifier using a first gain to produce a lower resolution amplified analog sensor output signal. To help prevent the amplifier from going out of range during a second measurement, a measure related to the lower resolution amplified analog sensor output signal may be used to determine an offset value, and the offset value may be applied to the analog sensor output signal during the second measurement, resulting in an offset analog sensor output signal. During the second measurement, the offset analog sensor output signal may be amplified using a second gain that is higher than the first gain to produce a higher resolution analog sensor output signal.

In some cases, the lower resolution amplified analog sensor output signal may be converted to a lower resolution digital sensor output signal, and stored in a memory. Likewise, the higher resolution analog sensor output signal may be converted to a higher resolution digital sensor output signal and stored in the memory. A composite digital sensor output signal may be computed using the lower resolution digital sensor output signal and the higher resolution digital sensor output signal.

An illustrative apparatus may include an variable gain amplifier block that has two or more gain settings. The amplifier block may receive an analog sensor output signal from a sensor. An offset block may selectively apply an offset to the analog sensor output signal when instructed to do so. A controller may be coupled to the amplifying block and the offset block. The controller may cause the amplifier block to amplify the analog sensor output signal using a first gain setting to produce a lower resolution analog sensor output signal. The controller may use a measure related to the lower resolution analog sensor output signal to determine an offset value, and may instruct the offset block to apply the determined offset value to the analog sensor output signal resulting in an offset analog sensor output signal. The controller may then cause the amplifier block to amplify the offset analog sensor output signal using a second gain setting that is higher than the first gain setting to produce a higher resolution analog sensor output signal.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
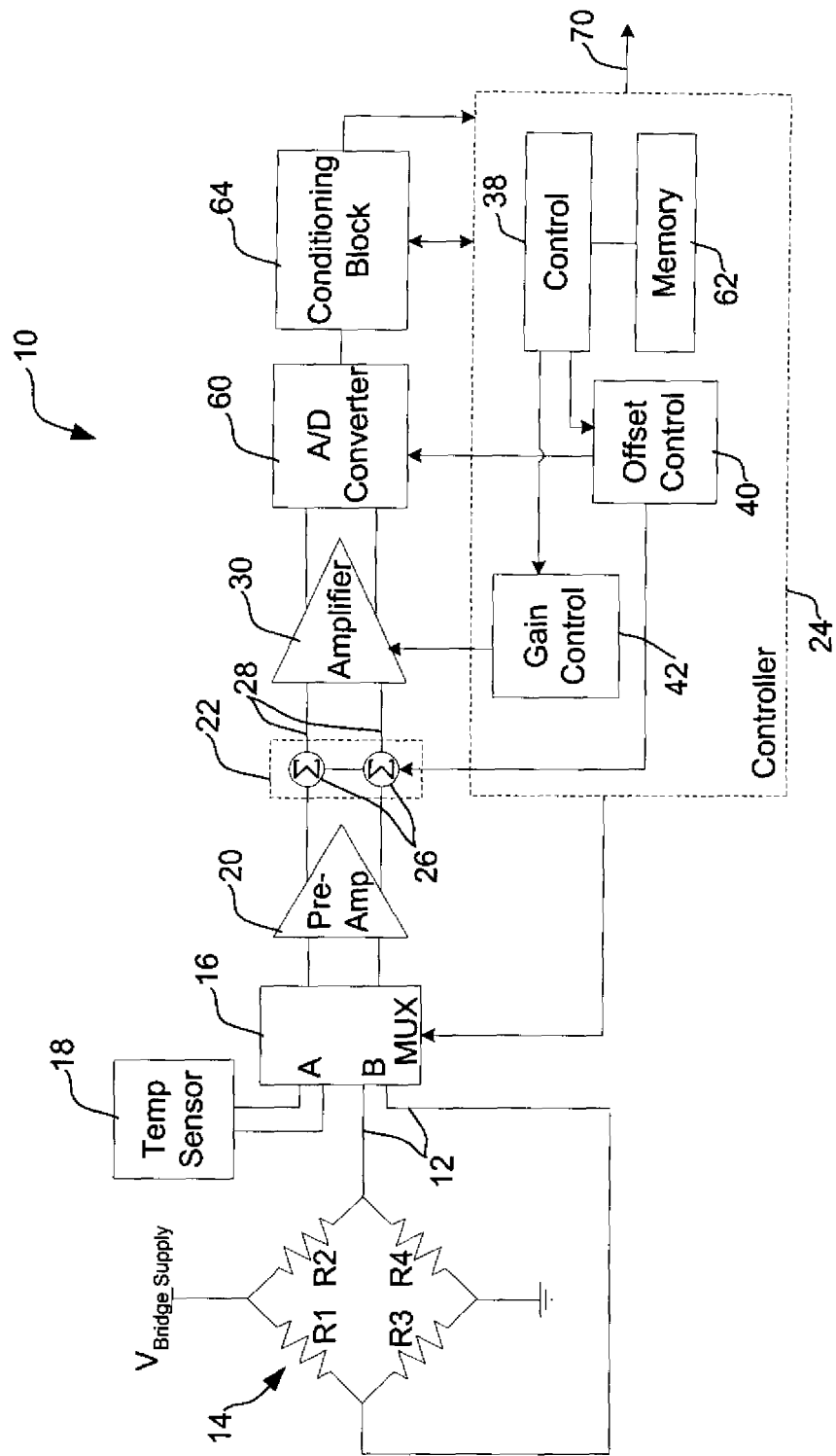
FIG. 1 is a schematic block diagram of an illustrative apparatus for processing an analog sensor output signal from a sensor.

While the disclosure is amenable to various modifications and alternative forms, specifics thereof have been shown by way of example in the drawings and will be described in detail. It should be understood, however, that the intention is not to limit the disclosure to the particular illustrative embodiments described herein. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings show several examples that are meant to be illustrative of the claimed disclosure.

FIG. 1 is a schematic block diagram of an illustrative apparatus 10 for processing an analog sensor output signal 12 of a sensor 14. In the illustrative embodiment, the sensor 14 may be any suitable sensor, such as a pressure sensor, a flow sensor, a magnetic proximity sensor, an accelerometer, a gyro or any other suitable sensor. The illustrative sensor 14 shown in FIG. 1 includes four sense resistors R1-R4 connected in a full Wheatstone bridge configuration, which provides a differential analog sensor output signal 12. This, however, is just one example sensor configuration, and it is contemplated that any suitable sensor type and/or sensor configuration may be used, as desired. Also, it is contemplated that the sensor 14 may produce a differential or single ended analog sensor output signal, as desired.

In the illustrative embodiment of FIG. 1, the analog sensor output signal 12 is provided to an "A" channel of a Multiplexer (MUX) 16. A "B" channel of MUX 16 is shown to be connected to the output of a temperature sensor 18. During operation, the MUX 16 can select between the "A" channel and the "B" channel, and can pass the selected signal to the input of a pre-amplifier 20. That is, in the illustrative embodiment of FIG. 1, the MUX 16 may pass the analog sensor output signal 12 to the pre-amplifier 20 when the "B" channel is selected, and may pass the output of the temperature sensor 18 to the pre-amplifier 20 when channel "A" is selected. The MUX 16 may be controlled by a controller 24.

In the illustrative embodiment of FIG. 1, the pre-amplifier 20 may amplify the analog sensor output signal 12, often with a relatively low gain (e.g. gain of 1). This may help isolate the sensor 14 from the downstream circuitry. It should be understood that MUX 16, pre-amplifier 20 and temperature sensor 18 are all optional and not required. Also, and in some instances, other circuitry may be included, such as conditioning circuitry (not shown) that can conditioning the analog sensor output signal 12, at least to some degree, before providing the signal to a variable gain amplifier 30. For example, conditioning circuitry may be included to help compensate for non-linearity or other non-desirable properties in the analog sensor output signal 12.

The analog sensor output signal 12 (sometimes after being passed through MUX 16 and/or pre-amplifier 20) may be provided to an offset block 22. In the illustrative embodiment, the offset block 22 may be controlled by an offset control block 40 of the controller 24. The offset block 22 may be capable of adding a controlled voltage offset to the analog sensor output signal when instructed to by the offset control block 40, resulting in an offset analog sensor output signal 28. In one example, offset block 22 may shift the voltage of the analog sensor output signal that is provided to the offset block 22 by adding (or subtracting) a voltage via summing elements 26, resulting in offset analog sensor output signal 28. In some cases, the offset control block 40 may shift the analog sensor output signal by zero volts, or by some other voltage as desired.

Figure 2:
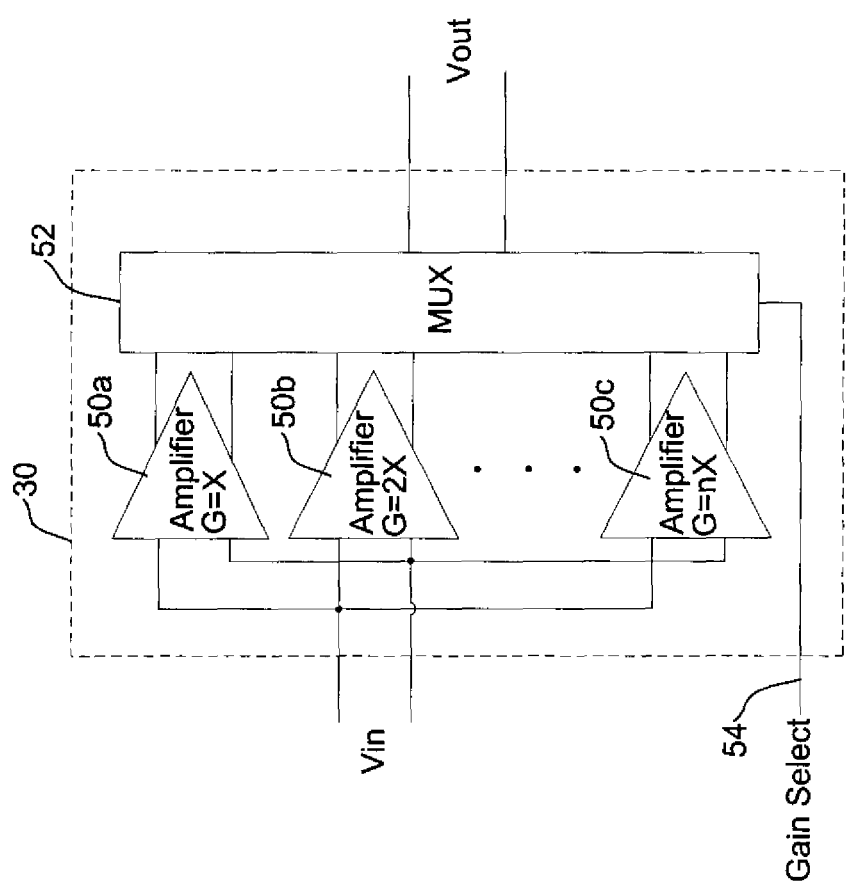
FIG. 2 is a schematic block diagram of an illustrative variable gain amplifier block.

In the illustrative embodiment of FIG. 1, the offset analog sensor output signal 28 is provided to the variable gain amplifier 30. The gain of the variable gain amplifier 30 may be controlled by a gain control block 42 of the controller 24. It is contemplated that the variable gain amplifier 30 may allow the controller 24 to vary the gain along a range of gain values, or may only allow discrete gain settings. An illustrative embodiment of a variable gain amplifier 30 that allows only discrete gain settings is shown in FIG. 2. In this illustrative embodiment, several amplifiers 50*a*-50C each have their inputs connected to input terminals (Vin) of the variable gain amplifier 30. Each of the amplifiers 50*a*-50C has a different gain. For example, amplifier 50*a* has a gain of "X", amplifier 50*b* has a gain of "2X", and amplifier 50*c* has a gain of "nX", where "n" is an integer greater than two. The outputs of the amplifiers 50*a*-50C are each connected to a separate channel of a multiplexer 52. A gain select terminal 54, which may be connected to gain control block 42 of controller 24 (see FIG. 1), may select which of the outputs of the amplifiers 50*a*-50C are passed to the output terminals (Vout) of the variable gain amplifier 30. This is just one example implementation of a variable gain amplifier, and it is contemplated that any suitable variable gain amplifier may be used, as desired.

Referring back to FIG. 1, in some instances, the output of the variable gain amplifier 30 may be passed to an Analog-to-Digital (A/D) Converter 60. The A/D converter 60 may convert the analog sensor output signal produced by the variable gain amplifier 30 into a digital sensor output signal. In some cases, the A/D converter may have an offset control, which can be controlled by offset control block 40 of controller 24, but this is not necessary. The digital sensor output signal produced by the A/D converter may be stored in a memory, such memory 62. In some cases, a conditioning block 64 may be provided to condition the digital sensor output signal before storing the digital sensor output signal into memory. The conditioning block 64 may, for example, help compensate for non-linearity or other non-desirable properties in the digital sensor output signal. In some cases, the conditioning block 64 may receive one or more conditioning coefficients from a memory, such as memory 62 of controller 24, but this is not required. In the embodiment shown, the controller may receive a compensated digital sensor output signal from the conditioning block 64 and store the result in memory 62. The controller 24 may then produce an output signal on output terminal 70. In some cases, a control block 38 of controller 24 may read program instructions from a memory, such as memory 62, and may execute the program instructions to control the gain control block 42, offset control block 40 and/or conditioning block 64, as desired.

Figure 3:
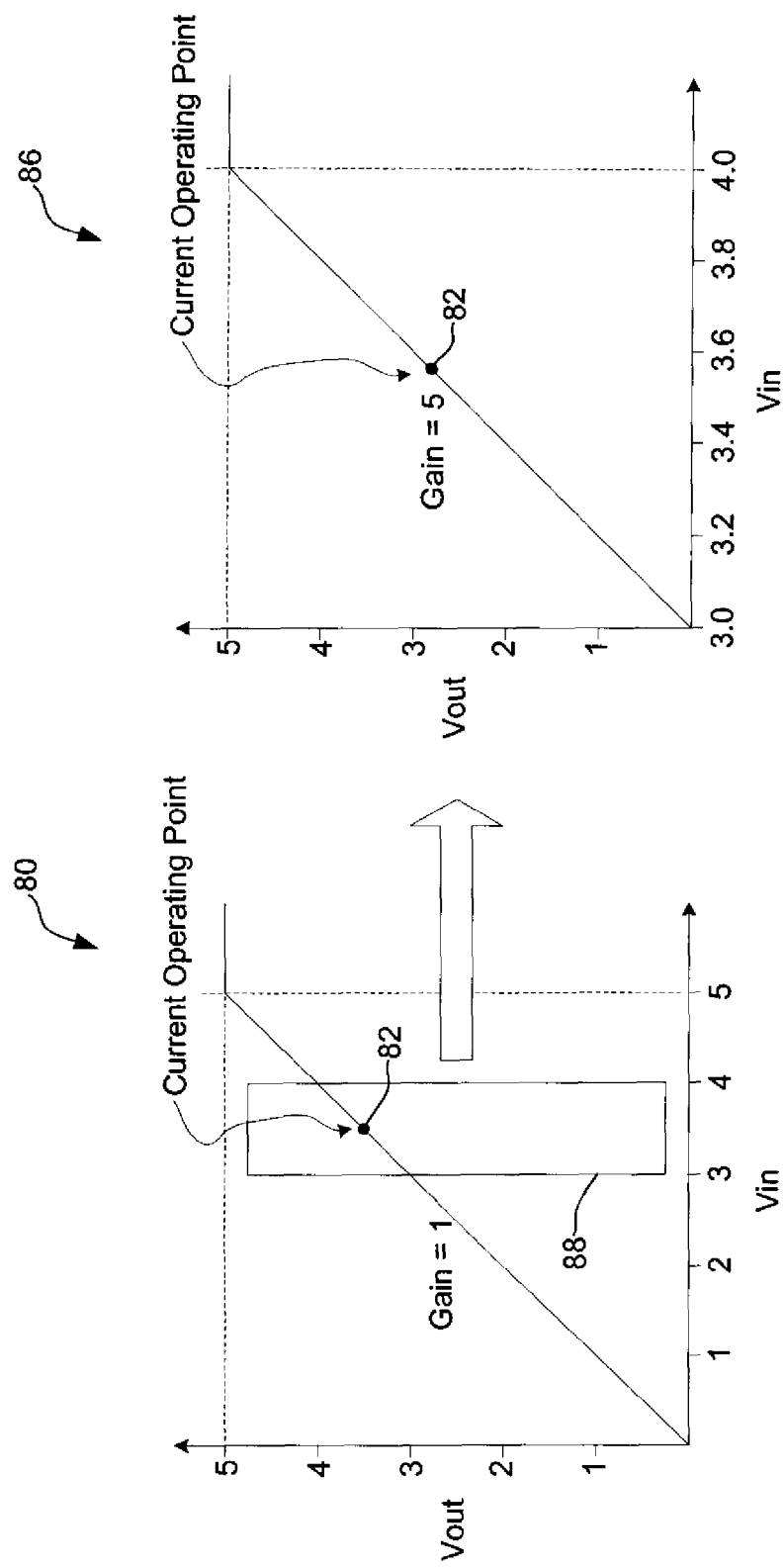
FIG. 3 shows a first measurement and a second measurement in accordance with an illustrative method for processing an analog sensor output signal.

During operation, the controller 24 may use a two measurement process to achieve an increased resolution signal for the sensor 14. During a first measurement, the offset control block 40 of the controller 24 may instruct the offset block 22 to add a zero (or low) offset to the analog sensor output signal. The gain control block 42 of the controller 24 may instruct the variable gain amplifier 30 to amplify the resulting signal using a first gain setting (e.g. gain 1-2) to produce a lower resolution analog sensor output signal. A graph 80 illustrating such a first measurement is shown in FIG. 3. As shown in FIG. 3, and because of the relatively low gain of the variable gain amplifier 30 (e.g. gain=1), the first measurement may be used to effectively measure across a wide or full range (e.g. 0 to 5 VDC) of the sensor 14, and as such, may be effective at identifying the current operating point 82 of the sensor 14 (e.g. 3.5 VDC output). The controller 24 may then identify and store the current operating point 82 of the sensor 14. In some cases, A/D converter 60 may convert the lower resolution analog sensor output signal to a lower resolution digital sensor output signal, and the controller 24 may store the lower resolution digital sensor output signal to the memory 62. This lower resolution digital sensor output signal may itself represent the current operating point 82 of the sensor 14.

A second measurement may then be used to measure across a sub-range of the sensor 14, where the sub-range encompasses the current operating point 82 of the sensor 14 as determined by the first measurement (e.g. across a sub-range of 3.0 to 4.0 VDC for a current operating point of 3.5 VDC). The gain of the amplifier may be higher during the second measurement, which may thus produce a higher resolution measurement signal. To help prevent the variable gain amplifier 30 from going out of range, the first measurement may be used to determine an appropriate offset that can be applied to focus the variable gain amplifier input on the sub-range of sensor 14 that includes the current operating point 82 of the sensor 14.

More specifically, during the second measurement, the controller 24 may use a measure related to the lower resolution analog sensor output signal to determine an offset value, and may instruct the offset block 22 of the controller 24 to add the determined offset value to the analog sensor output signal, resulting in an offset analog sensor output signal. The gain control block 42 of the controller 24 may then instruct the variable gain amplifier 30 to amplify the newly offset analog sensor output signal using a second gain setting that is higher than the first gain setting (e.g. gain 2-200) to produce a higher resolution analog sensor output signal.

A graph 86 illustrating an illustrative second measurement is shown in FIG. 3. As shown in FIG. 3, the controller 24 focuses the variable gain amplifier input on a sub-range 88 of sensor 14 that includes the current operating point 82 of the sensor 14. The illustrative sub-range 88 spans across an input voltage range of 3.0 to 4.0 volts, which includes the current operating point 82 of 3.5 volts. In FIG. 3, the gain control block 42 of the controller 24 has instructed the variable gain amplifier 30 to amplify the newly offset analog sensor output signal using a gain of five (5) during the second measurement 86, which is higher than the gain of one (1) used during the first measurement 80. This increased gain may produce a higher resolution analog sensor output signal. As shown in the example of FIG. 3, this higher resolution may reveal that the current operating point 82 is about 3.55 Volts, rather than 3.5 Volts as might be indicated by the first measurement 80. While a gain of five (5) is used as an example for the second measurement, it is contemplated that any suitable increased gain value may be used (e.g. 2-200). A high gain value will generally result in a narrow sub-range 88.

In some cases, A/D converter 60 may convert the higher resolution analog sensor output signal to a higher resolution digital sensor output signal, and the controller 24 may store the higher resolution digital sensor output signal to the memory 62. A composite digital sensor output signal may be computed using the lower resolution digital sensor output signal and the higher resolution digital sensor output signal. The composite signal may be provided on output terminal 70.

Figure 4:
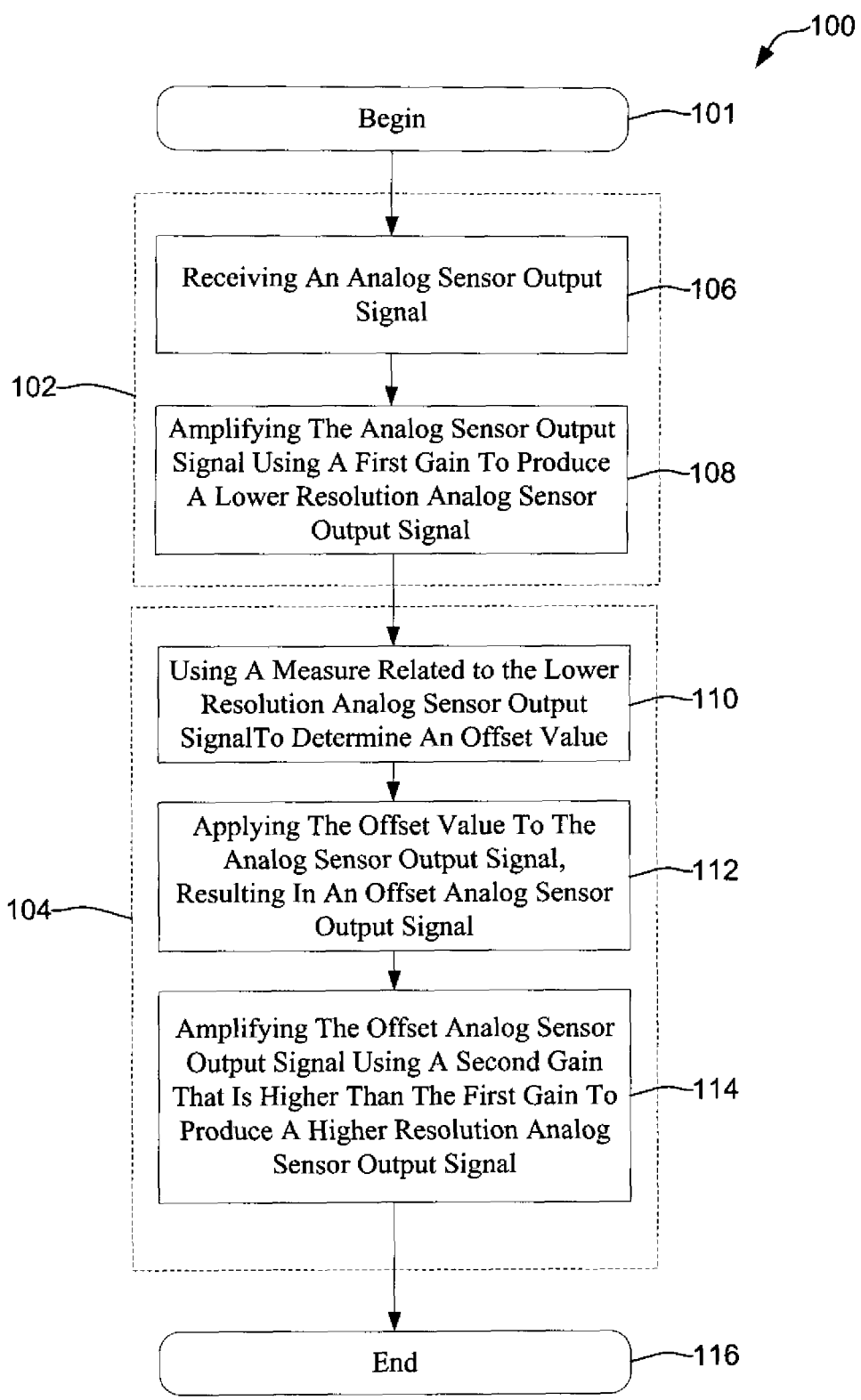
FIG. 4 is a flow diagram showing an illustrative method for processing an analog sensor output signal.

FIG. 4 is a flow diagram showing an illustrative method 100 for processing an analog sensor output signal. The illustrative method begins at 101, and may include a two measurement process, including a first measurement 102 and a second measurement 104. During the first measurement 102, an analog sensor output signal may be received from a sensor, as shown at 106. Next, the analog sensor output signal may be amplified using a first gain to produce a lower resolution amplified analog sensor output signal, as shown at 108.

During the second measurement 104, a measure related to the lower resolution amplified analog sensor output signal is used to determine an offset value, as shown at 110. Next, the offset value may be applied to the analog sensor output signal, resulting in an offset analog sensor output signal, as shown at 112. Then, the offset analog sensor output signal may be amplified using a second gain that is higher than the first gain to produce a higher resolution analog sensor output signal, as shown at 114. The illustrative method 100 may then be exited as shown at 116.

Figure 5:
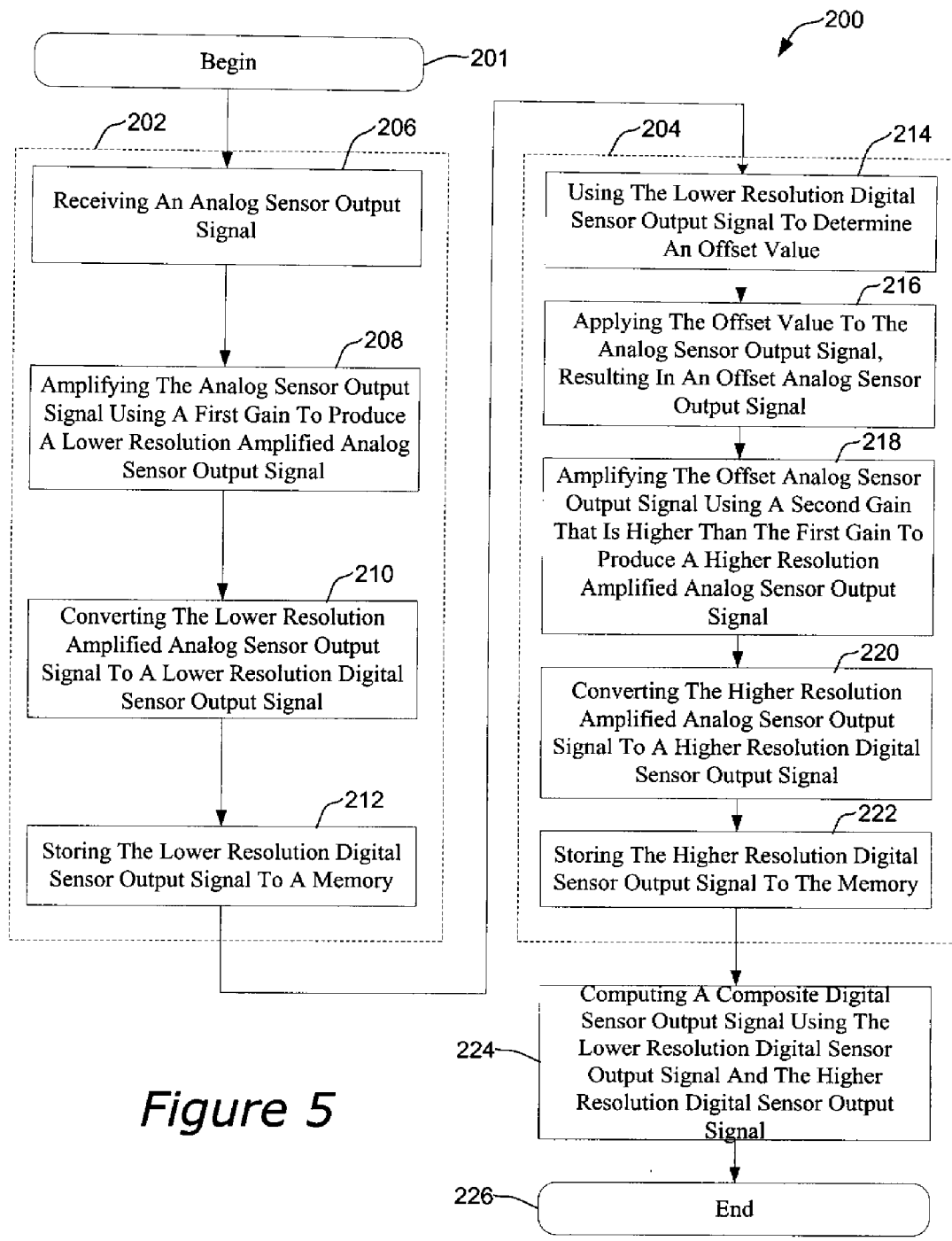
FIG. 5 is a flow diagram showing another illustrative method for processing an analog sensor output signal.

FIG. 5 is a flow diagram showing another illustrative method 200 for processing an analog sensor output signal. The illustrative method begins at 201, and may include a two measurement process, including a first measurement 202 and a second measurement 204.

During the first measurement 202, an analog sensor output signal may be received from a sensor, as shown at 206. Next, the analog sensor output signal may be amplified using a first gain to produce a lower resolution amplified analog sensor output signal, as shown at 208. Next, the lower resolution amplified analog sensor output signal may be converted to a lower resolution digital sensor output signal, as shown at 210, and store the lower resolution digital sensor output signal to a memory, as shown at 212.

During the second measurement 204, the lower resolution digital sensor output signal may be used to determine an offset value, as shown at 214. The offset value may be applied to the analog sensor output signal, resulting in an offset analog sensor output signal as shown at 216. The offset analog sensor output signal may then be amplified using a second gain that is higher than the first gain to produce a higher resolution amplified analog sensor output signal, as shown at 218. The higher resolution amplified analog sensor output signal may be converted to a higher resolution digital sensor output signal, as shown at 220. The higher resolution digital sensor output signal may then be stored to the memory, as shown at 222. In some cases, a composite digital sensor output signal may be computed using the lower resolution digital sensor output signal of the first measurement 202 and the higher resolution digital sensor output signal of the second measurement 204. The illustrative method 200 may then be exited as shown at 226.

Figure 6:
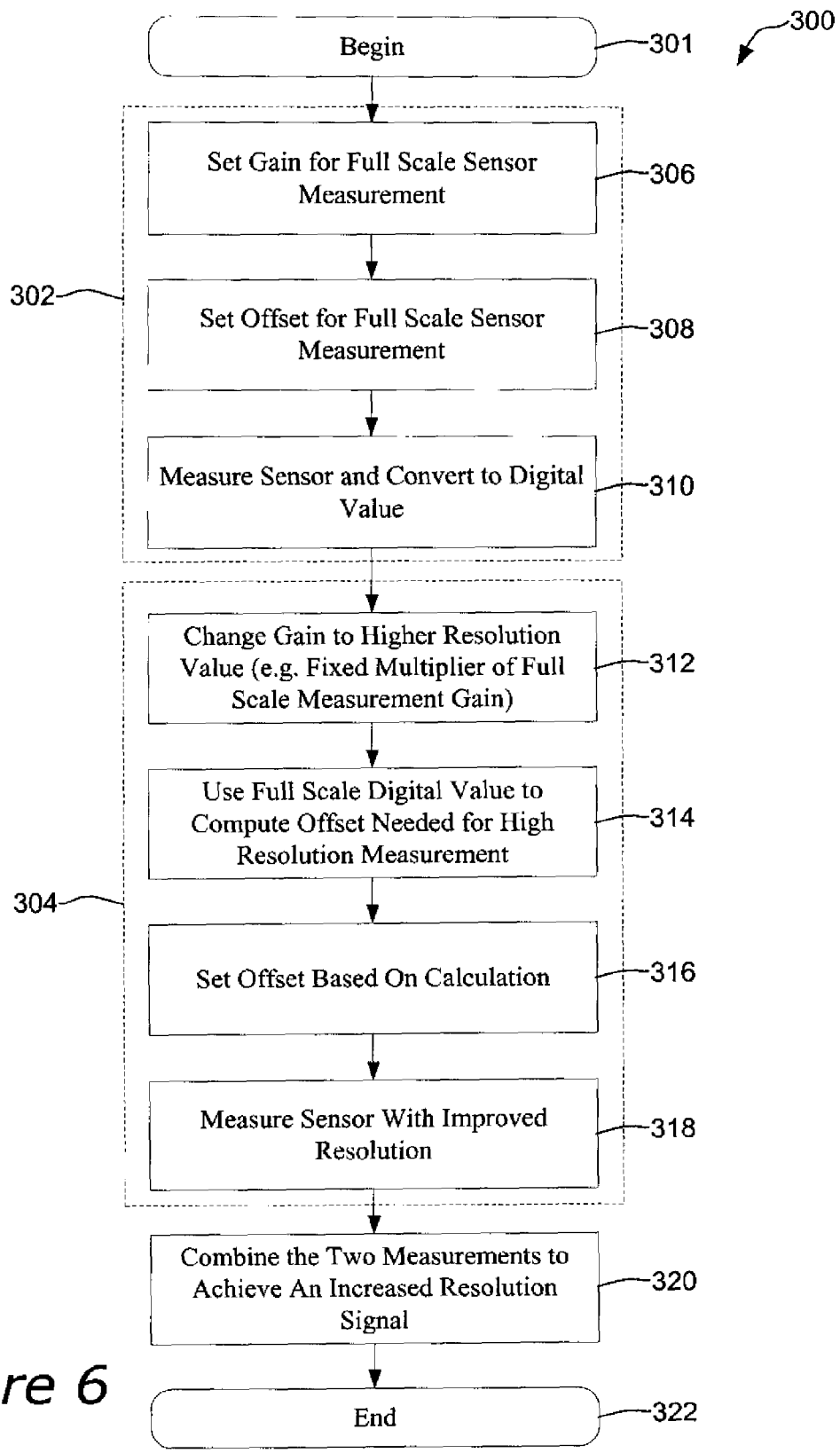
FIG. 6 is a flow diagram showing an illustrative method for processing an analog sensor output signal.

FIG. 6 is a flow diagram showing an illustrative method 300 for processing an analog sensor output signal. The illustrative method begins at 301, and may include a two measurement process, including a first measurement 302 and a second measurement 304. During the first measurement 302, the gain of an amplifier may be set for a full scale sensor measurement, as shown at 306. The offset may also be set for a full scale sensor measurement, as shown at 308. Next, the sensor output may be measured using the above-mentioned gain and offset values, and the result may be converted to a digital value as shown at 310.

During the second measurement 304, the gain of the amplifier may be changed to a higher value to achieve a higher resolution, as shown at 312. The full scale digital value measured during the first measurement 302 may be used to compute an offset needed for a higher resolution measurement, as shown at 314. The offset may then be set accordingly, as shown at 316. Then, the sensor output may be measured using the higher gain and computed offset value, as shown at 318. The result may be converted to a digital value. The digital value of the first measurement 302 and the digital value of the second measurement 304 may be combined to achieve an increased resolution signal for the sensor, as shown at 320. The illustrative method 200 may then be exited as shown at 322.

Figure 7:
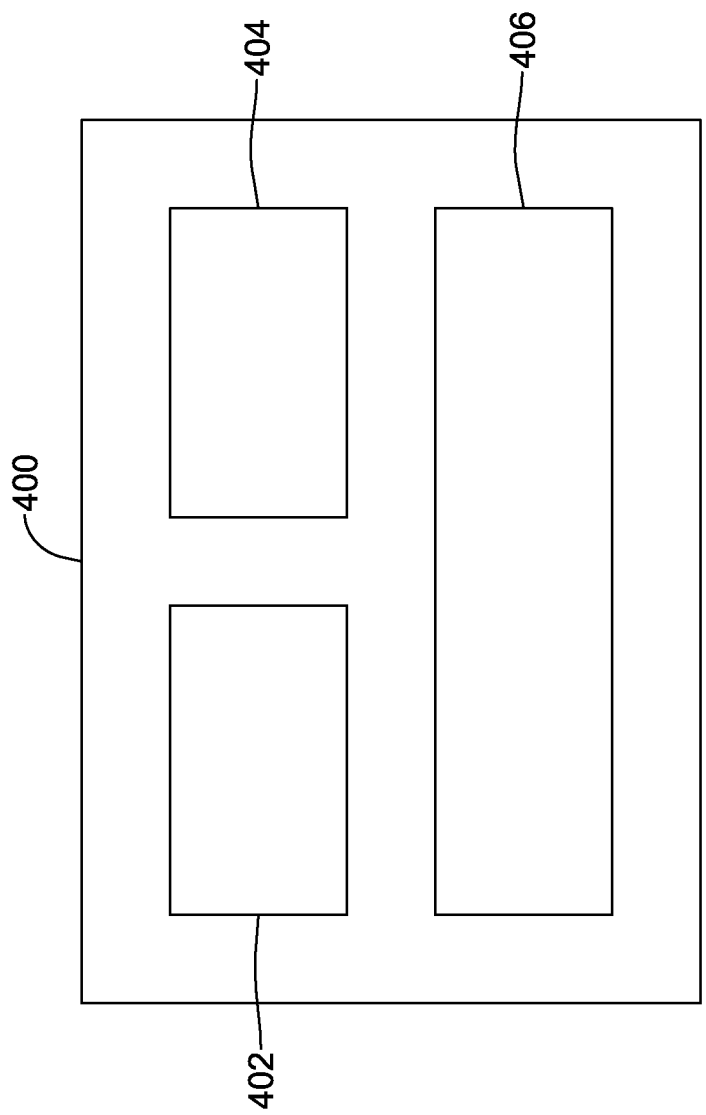
FIG. 7 is a block diagram of an integrated circuit.

FIG. 7 is a block diagram of an amplifier block 402, an offset block 404 and a controller 406 situated on a common integrated circuit 400.

Having thus described various illustrative embodiments of the present disclosure, those of skill in the art will readily appreciate that yet other embodiments may be made and used within the scope of the claims hereto attached. Changes may be made in details, particularly in matters of shape, size, and arrangement of parts without exceeding the scope of the disclosure. The disclosure's scope is, of course, defined in the language in which the appended claims are expressed.

What is claimed is:

1. Apparatus for processing an analog sensor output signal from a sensor, comprising:

an amplifier block, the amplifier block having two or more gain settings, the amplifier block receiving an analog sensor output signal from the sensor;

an offset block for selectively applying an offset to the analog sensor output signal when instructed to do so to output an offset analog sensor output signal; and a controller coupled to the amplifying block and the offset block, the controller causing the amplifier block to amplify the analog sensor output signal using a first gain setting to produce a lower resolution analog sensor output signal over a first range, the controller using a measure related to the lower resolution analog sensor output signal to determine an offset value, the controller instructing the offset block to apply the determined offset value to the analog sensor output signal, resulting in the offset analog sensor output signal, the controller also causing the amplifier block to amplify the offset analog sensor output signal using a second gain setting that is higher than the first gain setting to produce a higher resolution analog sensor output signal over a second range, wherein the second range is a subset of the first range.

2. The apparatus of claim 1, further comprising:
an analog-to-digital converter;
a memory; and
wherein the analog-to-digital converter converts the lower resolution analog sensor output signal to a lower resolution digital sensor output signal, and the controller stores the lower resolution digital sensor output signal to the memory, the controller further using the lower resolution digital sensor output signal stored in the memory to determine the offset value.

3. The apparatus of claim 2, wherein the analog-to-digital converter converts the higher resolution analog sensor output signal into a higher resolution digital sensor output signal, and the controller stores the higher resolution digital sensor output signal to the memory.

4. The apparatus of claim 3, wherein the controller determines a composite digital sensor output signal using the lower resolution digital sensor output signal and the higher resolution digital sensor output signal, and outputs the composite digital sensor output signal.

5. The apparatus of claim 4, wherein the controller stores the composite digital sensor output signal to the memory.

6. The apparatus of claim 1, wherein the analog sensor output signal corresponds to an output of a Wheatstone bridge.

7. The apparatus of claim 1, wherein the analog sensor output signal corresponds to an output of a pressure sensor.

8. The apparatus of claim 1, wherein the analog sensor output signal corresponds to an output of a flow sensor.

9. The apparatus of claim 1, wherein the analog sensor output signal corresponds to an output of a magnetic proximity sensor.

10. The apparatus of claim 1, wherein the analog sensor output signal corresponds to an output of an accelerometer or gyro.

11. The apparatus of claim 1, further comprises a pre-amplifier that pre-amplifies the analog sensor output signal before the analog sensor output signal reaches the amplifier block.

12. The apparatus of claim 1, wherein the amplifier block includes a variable gain amplifier.

13. The apparatus of claim 1, wherein the amplifier block, the offset block and the controller are situated on a common integrated circuit.

14. A method for processing an analog sensor output signal comprising:
receiving an analog sensor output signal from a sensor;
amplifying the analog sensor output signal using a first gain to produce a lower resolution amplified analog sensor output signal;
using a measure related to the lower resolution amplified analog sensor output signal to determine an offset value;
applying the offset value to the analog sensor output signal, resulting in an offset analog sensor output signal; and
amplifying the offset analog sensor output signal using a second gain that is higher than the first gain to produce a higher resolution analog sensor output signal.

15. The method of claim 14, wherein the offset value is determined by:
converting the lower resolution amplified analog sensor output signal to a lower resolution digital sensor output signal;
storing the lower resolution digital sensor output signal to a memory;
using the lower resolution digital sensor output signal to determine the offset value.

16. The method of claim 15, further comprising:
converting the higher resolution analog sensor output signal to a higher resolution digital sensor output signal.

17. The method of claim 16, further comprising:
computing a composite digital sensor output signal using the lower resolution digital sensor output signal and the higher resolution digital sensor output signal.

18. A method for processing an analog sensor output signal, comprising:
receiving an analog sensor output signal;
amplifying the analog sensor output signal using a first gain to produce a lower resolution amplified analog sensor output signal;
converting the lower resolution amplified analog sensor output signal to a lower resolution digital sensor output signal;
storing the lower resolution digital sensor output signal to a memory;
using the lower resolution digital sensor output signal to determine an offset value;
applying the offset value to the analog sensor output signal, resulting in an offset analog sensor output signal;
amplifying the offset analog sensor output signal using a second gain that is higher than the first gain to produce a higher resolution amplified analog sensor output signal; and
converting the higher resolution amplified analog sensor output signal to a higher resolution digital sensor output signal.

19. The method of claim 18, further comprising storing the higher resolution digital sensor output signal to the memory.

20. The method of claim 18, further comprising:
computing a composite digital sensor output signal using the lower resolution digital sensor output signal and the higher resolution digital sensor output signal.

* * * * *